United States Patent [19]

Koizumi et al.

[11] Patent Number: 4,985,339

[45] Date of Patent: Jan. 15, 1991

[54] LIGHT-SENSITIVE MATERIAL CONTAINING SILVER HALIDE, REDUCING AGENT, POLYMERIZABLE COMPOUND AND A POLYMERIC BINDER

[75] Inventors: Shigeo Koizumi, Shizuoka; Yoshihide Hayakawa, Tokyo, both of Japan

[73] Assignee: Fuji Photo Film Co., Ltd., Kanagawa, Japan

[21] Appl. No.: 217,207

[22] Filed: Jul. 11, 1988

[30] Foreign Application Priority Data

Jul. 10, 1987 [JP] Japan .................................. 62-172400

[51] Int. Cl.$^5$ ............................ G03C 1/68; G03C 1/72
[52] U.S. Cl. ..................................... 430/270; 430/281; 430/285; 430/287; 430/288; 430/302; 430/545; 430/910
[58] Field of Search ................ 430/270, 281, 285, 287, 430/288, 545, 302, 910, 264

[56] References Cited

U.S. PATENT DOCUMENTS

| | | | |
|---|---|---|---|
| 4,293,635 | 10/1981 | Flint et al. | 430/288 |
| 4,350,759 | 9/1982 | Fitzgerald et al. | 430/630 |
| 4,353,978 | 10/1982 | Leberzammer et al. | 430/291 |
| 4,448,850 | 5/1984 | Upsun et al. | 430/510 |
| 4,537,855 | 8/1985 | Ide | 430/285 |
| 4,557,997 | 12/1985 | Iwasaki et al. | 430/325 |
| 4,629,676 | 12/1986 | Hayakawa et al. | 430/203 |
| 4,687,727 | 8/1987 | Toyama et al. | 430/175 |
| 4,722,885 | 2/1988 | Yokoyama et al. | 430/531 |
| 4,764,451 | 8/1988 | Ishikawa | 430/138 |
| 4,806,449 | 2/1989 | Hofmann et al. | 430/287 |
| 4,806,450 | 2/1989 | Hofmann et al. | 430/287 |

FOREIGN PATENT DOCUMENTS 203613  12/1986  European Pat. Off. ............ 430/138

*Primary Examiner*—Paul R. Michl
*Assistant Examiner*—Patrick Doody
*Attorney, Agent, or Firm*—Sughrue, Mion, Zinn, Macpeak & Seas

[57] ABSTRACT

A light-sensitive material comprises a light-sensitive layer containing a light-sensitive silver halide, a reducing agent and a polymerizable compound having an ethylenic unsaturated group which is provided on a support. The light-sensitive layer contains a polymer binder having an ethylenic unsaturated double bonding group in its side chain. The light-sensitive material is advantageously employable as a lithographic plate.

6 Claims, No Drawings

LIGHT-SENSITIVE MATERIAL CONTAINING SILVER HALIDE, REDUCING AGENT, POLYMERIZABLE COMPOUND AND A POLYMERIC BINDER

FIELD OF THE INVENTION

The present invention relates to a light-sensitive material comprising a light-sensitive layer containing a light-sensitive silver halide, a reducing agent and a polymerizable compound provided on a support.

BACKGROUND OF THE INVENTION

Light-sensitive materials comprising a light-sensitive layer containing silver halide, a reducing agent and a polymerizable compound provided on a support can be used in an image forming method in which a latent image of silver halide is formed, and then the polymerizable compound is polymerized to form the corresponding image.

Examples of said image forming methods are described in Japanese Patent Publications Nos. 45(1970)-11149 (corresponding to U.S. Pat. No. 3,697,275), 47(1972)-20741 (corresponding to U.S. Pat. No. 3,687,667) and 49(1974)-10697, and Japanese Patent Provisional Publications Nos. 57(1982)-138632, 57(1982)-142638, 57(1982)-176033, 57(1982)-211146 (corresponding to U.S. Pat. No. 4,557,997), 58(1983)-107529 (corresponding to U.S. Pat. No. 4,560,637), 58(1983)-121031 (corresponding to U.S. Pat. No. 4,547,450) and 58(1983)-169143. In these image forming methods, when the exposed silver halide is developed using a developing solution, the polymerizable compound is induced to polymerize in the presence of a reducing agent (which is oxidized) to form a polymer image. Thus, these methods need a wet development process employing a developing solution. Therefore, the process takes a relatively long time.

An improved image forming method employing a dry process is described in Japanese Patent Provisional Publications Nos. 61(1986)-69062 and 61(1986)-73145 (the contents of both publications are described in U.S. Pat. No. 4,629,676. In this image forming method, a recording material (i.e., light-sensitive material) comprising a light-sensitive layer containing a light-sensitive silver salt (i.e., silver halide), a reducing agent, a cross-linkable compound (i.e., polymerizable compound) and a binder provided on a support is imagewise exposed to light to form a latent image, and then the material is heated to polymerize within the area where the latent image of the silver halide has been formed. The above method employing the dry process and the light-sensitive material employable for such method are also described in Japanese Patent Provisional Publications Nos. 61(1986)-183640, 61(1986)-188535 and 61(1986)-228441.

The above-mentioned image forming methods are based on the principle in which the polymerizable compound is polymerized in the portion where a latent image of the silver halide has been formed.

Further, Japanese Patent Provisional Publication No. 61(1986)-260241 describes another image forming method in which the polymerizable compound in a portion where a latent image of the silver halide has not been formed is polymerized. In the method, when the material is heated, the reducing agent functions as polymerization inhibitor in the portion where a latent image of the silver halide has been formed, and the polymerizable compound in the other portion is polymerized.

According to the above image forming method, a polymer image of the polymerizable compound can be easily obtained on the light-sensitive material by utilizing high sensitivity of the photo-sensitive silver halide.

It has been noted that when the polymer in the form of an image (i.e., image relief) is cured incompletely, quality of the image decreases, that is, clearness of the image lowers, because the image made of the incompletely cured polymer is easily damaged due to its poor strength (i.e., poor hardness). Especially, when the light-sensitive material is employed as a lithographic plate, the problem of an image relief of low hardness is troublesome, because the sufficiently high hardness (to impart to the polymer image high resistance against plate wear) is required in the obtained image relief.

Various presensitized lithographic plates (referred to hereinafter as PS plate) are proposed in Japanese Provisional Publications Nos. 57(1982)-211146 and 58(1983)-16231. However, these PS plates employ a wet development process using a developing solution to prepare a lithographic plate, whereby the obtained image is apt to swell.

SUMMARY OF THE INVENTION

An object of the present invention is to provide a light-sensitive material which can give an image relief (relief of an image) having high hardness.

Another object of the invention is to provide a light-sensitive material which is favorablly used as a presensitized lithographic plate (PS plate).

There is provided by the present invention a light-sensitive material comprising a light-sensitive layer containing a light-sensitive silver halide, a reducing agent and a polymerizable compound provided on a hydrophilic support, wherein the light-sensitive layer contains a polymer binder having an ethylenic unsaturated double bonding group in its side chain.

The light-sensitive material of the present invention comprises a light-sensitive layer containing a polymer binder having an ethylenic unsaturated double bonding group at its side chain, which is capable of participating in a cross-linking reaction. Accordingly, a polymer image (which may be in the form of an image relief) having high hardness can be formed by the image forming method.

In more detail, the polymer binder can form a cross-linked three-dimensional network structure together with the polymerizable compound through addition polymerization reaction after exposure to light or development following the exposure. Therefore, a polymer image (or image relief) having improved high hardness (i.e., high strength) can be obtained as compared with a polymer image (or image relief) which is formed by simple polymerization of the polymerizable compound. Accordingly, a clear image can be obtained.

Especially, when the light-sensitive material of the present invention is employed as a lithographic plate, resistance of the image relief to plate wear is improved. Further, when the light-sensitive material of the invention is employed as a lithographic plate and the heat development (i.e., dry development) is adopted, the obtained polymer image is hardly swelled. Furthermore, after the heat development, the strength of the image relief does not decrease even if a wet process is used to obtain the image relief.

DETAILED DESCRIPTION OF THE INVENTION

A binder which is employed for the light-sensitive material of the invention is a polymer having an ethylenic unsaturated double bonding group in its side chain.

There is no specific limitation with respect to the polymer. Concrete examples of the polymers include:

(1) copolymer of allyl (meth)acrylate and other monomer copolymerizable with the (meth)acrylate, such as monohydroxyalkyl (meth)acrylate, polyethyleneglycol mono(meth)acrylate, polypropyleneglycol mono(meth)acrylate or an alkali metal salt of (meth)acrylic acid;

(2) polymer produced by reaction of hydroxyethyl (meth)acrylate copolymer and (meth)acrylic acid chloride;

(3) polymer produced by semi-esterification of maleic anhydride copolymer with pentaerythritol triacrylate;

(4) polymer produced by semi-esterification of styrene/maleic anhydride copolymer with monohydroxyalkyl (meth)acrylate, polyethyleneglycol mono(meth)acrylate or polypropyleneglycol mono(meth)acrylate;

(5) polymer produced by reaction of (meth)acrylate copolymer or crotonic acid copolymer and glycidyl (meth)acrylate;

(6) polymer produced by reaction of hydroxyalkyl (meth)acrylate copolymer, polyvinylformal or polyvinylbutylal and maleic anhydride or itaconic anhydride;

(7) polymer produced by the reaction of hydroxyalkyl (meth)acrylate copolymer and the 1/1 adduct of 2,4-toluenediisocyanate and hydroxyalkyl (meth)acrylate;

(8) polymer produced by reaction of (meth)acrylate copolymer and allylglycidyl ether;

(9) copolymer of vinyl (meth)acrylate and other monomer copolymerizable with the (meth)acrylate, such as monohydroxyalkyl (meth)acrylate, polyethyleneglycol mono(meth)acrylate, polypropyleneglycol mono(meth)acrylate or an alkali metal salt of (meth)acrylic acid; and

(10) polymer produced by reaction of hydroxyalkyl (meth)acrylate copolymer and N-methylolacrylamide.

The above polymers can be used singly or in combination. In the present invention, the allyl (meth)acrylate copolymer and vinyl (meth)acrylate copolymer are preferred. The molecular weight of the binder polymer generally is in the range of from 10,000 to 500,000.

The above copolymers can be obtained by processes described in Japanese Patent Provisional Publications Nos. 59(1984)-53836 (corresponding to European Patent No. 104,863) and 59(1984)-71048 (corresponding to U.S. Pat. No. 4,537,855).

The binder can be incorporated at a stage of the preparation of a light-sensitive composition comprising the later-described silver halide emulsion, reducing agent and polymerizable compound, or can be added to a coating solution for the preparation of a light-sensitive layer, in consideration of nature of the binder such as easiness of forming of an emulsion.

In the light-sensitive material of the invention, the binder is preferably contained in an amount of 5 to 70 weight % based on the content of material constituting the light-sensitive layer, and more preferably 10 to 50 weight %.

The silver halide, reducing agent, polymerizable compound and support which constitute the light-sensitive material of the invention are described below.

As is described hereinbefore, the light-sensitive material is advantageously employable as a presensitized lithographic plate (PS plate). Accordingly, the light-sensitive material of the invention are described hereinbelow by referring to the case that the light-sensitive material is employed as the PS plate.

There is no specific limitation with respect to the ligh-sensitive silver halide contained in the light-sensitive layer of the PS plate. Examples of the silver halides include as silver chloride, silver bromide, silver iodide, silver chlorobromide, silver chloroiodide, silver iodobromide, and silver chloroiodobromide in the form of grains.

The halogen composition of individual grains may be homogeneous or heterogeneous. The heterogeneous grains having a multilayered structure in which the halogen composition varies from the core to the outer shell (see Japanese Patent Provisional Publications Nos. 57(1982)-154232, 58(1983)-108533, 59(1984)-48755 and 59(1984)-52237, U.S. Pat. No. 4,433,048, and European Patent No. 100,984) can be employed. A silver halide grain having a core/shell structure in which the silver iodide content in the shell is higher than that in the core can be also employed.

There is no specific limitation on the crystal habit of silver halide grains. For example, a tubular grain having an aspect ratio of not less than 3 can be used.

The silver halide grains preferably have such a relatively low tendency to be fogged that the amount of developed silver is not more than 5 weight % based on the total amount of silver when the unexposed silver halide grains are developed in 1 l of an aqueous developing solution containing 1.0 g of metol, 15.0 g of sodium sulfite, 4.0 g of hydroquinone, 26.7 g of sodium carbonate monohydrate and 0.7 g of potassium bromide.

Two or more kinds of silver halide grains which differ in halogen composition, crystal habit, grain size, and/or other features from each other can be used in combination.

There is no specific limitation on grain size distribution of silver halide grains. For example, the silver halide grains having such a grain size distribution that the coefficient of the variation is not more than 20% can be employed.

The silver halide grains ordinarily have a mean size of 0.001 to 5 $\mu$m, more preferably 0.001 to 2 $\mu$m.

The total silver content (including silver halide and an organic silver salt which is one of optional components) in the light-sensitive layer preferably is in the range of from 0.1 mg/m$^2$ to 10 g/m$^2$. The silver content of the silver halide in the light-sensitive layer preferably is not more than 1 g/m$^2$, more preferably in the range of from 1 mg to 500 mg/m$^2$.

The reducing agent employed in the PS plate has a function of reducing the silver halide and/or a function of accelerating or restraining a polymerization of the polymerizable compound. Examples of the reducing agents having these functions include various compounds, such as hydroquinones, catechols, p-aminophenols, p-phenylenediamines, 3-pyrazolidones, 3-aminopyrazoles, 4-amino-5-pyrazolones, 5-aminouracils, 4,5-dihydroxy-6-aminopyrimidines, reductones, aminoreductones, o- or p-sulfonamidophenols, o- or p-sulfonamidonaphthols, 2-sulfonamidoindanones, 4-sulfonamido-5-pyrazolones, 3-sulfonamidoindoles, sulfonamidopyrazolobenzimidazoles, sulfonamidopyrazolotriazoles, $\alpha$-sulfonamidoketones, hydrazines, etc. Depending on the nature or amount of the reducing agent, the polymerizable compound within either the area where a latent image of the silver halide has been formed or the area where a latent image of the silver halide has not been formed can be polymerized. In the developing system in which the polymerizable compound within the area where the latent image has not been formed is polymerized, 1-phenyl-3-pyrazolidone is preferably employed as the reducing agent.

The PS plates employing the reducing agent which has these functions (including compounds referred to as developing agent, hydrazine derivative or precursor of reducing agent) are described in Japanese Patent Provisional Publications Nos. 61(1986)-183640, 61(1986)-188535 and 61(1986)-228441. These reducing agents are also stated in T. James, "The Theory of the Photographic Process", 4th edition, pp. 291-334 (1977), Research Disclosure No. 17029, pp. 9-15 (June 1978), and Research Disclosure No. 17643, pp. 22-31 (Dec. 1978). The reducing agents described in the these publications can be employed in the PS plate of the present invention. Thus, "reducing agent(s)" in the present specification means to include all of the reducing agents described in the above-mentioned publications and applications.

These reducing agents can be used singly or in combination. In the case that two or more reducing agents are used in combination, it is preferred to use a hydroquinone-type reducing agent as one reducing agent. In such case, certain interactions between these reducing agents can be expected. One of the interactions is for acceleration of reduction of silver halide (and/or an organic silver salt) through so-called superadditivity. Other interaction is for a chain reaction in which an oxidized state of one reducing agent formed by a reduction of silver halide (and/or an organic silver salt) induces or inhibits the polymerization of the polymerizable compound via oxidation-reduction reaction with other reducing agent. Both interactions may occur simultaneously. Thus, it is difficult to determine which of the interactions has occurred in practical use.

Examples of these reducing agents include pentadecylhydroquinone, 5-t-butylcatechol, p-(N,N-diethylamino)phenol, 1-phenyl-4-methyl-4-hydroxymethyl-3-pyrazolidone, 1-phenyl-4-methyl-4-heptadecylcarbonyloxymethyl-3-pyrazolidone, 2-phenylsulfonylamino-4-hexadecyloxy-5-t-octylphenol, 2-phenylsulfonylamino-4-t-butyl-5-hexadecyloxyphenol, 2-(N-butylcarbamoyl)-4-phenylsulfonylaminonaphtol, 2-(N-methyl-N-octadecylcarbamoyl)-4-sulfonylaminonaphthol, 1-acetyl-2-phenylhydrazine, 1-acetyl-2-(p- or o-aminophenyl)hydrazine, 1-formyl-2-(p- or o-aminophenyl)hydrazine, 1-acetyl-2-(p- or o-methoxyphenyl)hydrazine, 1-lauroyl-2-(p- or o-aminophenyl)hydrazine, 1-trityl-2-(2,6-dichloro-4-cyanophenyl)hydrazine, 1-trityl-2-phenylhydrazine, 1-phenyl-2-(2,4,6-trichlorophenyl)hydrazine, 1-{2-(2,5-di-tert-pentylphenoxy)-butyloyl}-2-(p- or o-aminophenyl)hydrazine, 1-{2-(2,5-di-t-pentylphenoxy)butyloyl}-2-(p-or o-aminophenyl)-hydrazine pentadecylfluorocaprylate salt, 3-indazolinone, 1-(3,5-dichlorobenzoyl)-2-phenylhydrazine, 1-trityl-2-[{(2-N-butyl-N-octylsulfamoyl)-4-methanesulfonyl}phenyl]hydrazine, 1-{4-(2,5-di-tert-pentylphenoxy)butyloyl}-2-(p-or o-methoxyphenyl)hydrazine, 1-(methoxycarbonylbenzohydryl)-2-phenylhydrazine, 1-formyl-2-[4-{2-(2,4-di-tert-pentylphenoxy)-butylamide}phenyl]hydrazine, 1-acetyl-2-[4-{2-(2,4-di-tert-pentylphenoxy)butylamido}phenyl]hydrazine, 1-trityl-2-[{2,6-dichloro-4-(N,N-di-2-ethylhexyl)carbamoyl}phenyl]hydrazine, 1-(methoxycarbonylbenzohydryl)-2-(2,4-dichlorophenyl)hydrazine, 1-trityl-2-[{2-(N-ethyl-N-octylsulfamoyl)-4-methanesulfonyl}phenyl]hydrazine, 1-benzoyl-2-tritylhydrazine, 1-(4-butoxybenzoyl)-2-tritylhydrazine, 1-(2,4-dimethoxybenzoyl)-2-tritylhydrazine, 1-(4-dibutylcarbamoylbenzoyl)-2-tritylhydrazine and 1-(1-naphthoyl)-2-tritylhydrazine.

The amount of the reducing agent in the light-sensitive layer preferably ranges from 0.1 to 1,500 mole % based on the amount of silver (contained in the above-mentioned silver halide and an organic silver salt).

There is no specific limitation with respect to the polymerizable compound, except that the compound has an ethylenic unsaturated group. In the case that heat development (i.e., thermal development) is utilized, the polymerizable compounds having a relatively higher boiling point (e.g., 80° C. or higher) that are hardly evaporated upon heating are preferably employed.

The polymerizable compound employable for the PS plate are described in the above-mentioned and later-mentioned publications concerning the light-sensitive material.

Examples of the compounds having an ethylenic unsaturated group include acrylic acid, salts of acrylic acid, acrylic esters, acrylamides, methacrylic acid, salts of methacrylic acid, methacrylic esters, methacrylamide, maleic anhydride, maleic esters, itaconic esters, styrene, styrene derivatives, vinyl ethers, vinyl esters, N-vinyl heterocyclic compounds, allyl ethers, allyl esters, and compounds carrying a group or groups corresponding to one or more of these compounds. In order to prepare a light-sensitive layer consisting of a lipophilic continuous phase (which is the preferred embodiment of the invention), the compounds reduced in hydrophilic property are preferred.

Concrete examples of the acrylic esters include n-butyl acrylate, cyclohexyl acrylate, 2-ethylhexyl acrylate, benzyl acrylate, furfuryl acrylate, ethoxyethoxy acrylate, dicyclohexyloxyethyl acrylate, nonylphenyloxyethyl acrylate, hexanediol diacrylate, butanediol diacrylate, neopentylglycol diacrylate, trimethylolpropane triacrylate, pentaerythritol tetraacrylate, dipentaerythritol pentaacrylate, diacrylate of polyoxyethylenated bisphenol A, polyacrylate of hydroxypolyether, polyester acrylate, and polyurethane acrylate.

Concrete examples of the methacrylic esters include methyl methacrylate, butyl methacrylate, ethylene glycol dimethacrylate, butanediol dimethacrylate, neopentylglycol dimethacrylate, trimethylolpropane trimethacrylate, pentaerythritol trimethacrylate, pentaerythritol tetramethacrylate, and dimethacrylate of polyoxyalkylenated bisphenol A.

The polymerizable compounds can be used singly or in combination of two or more compounds. For example, a mixture of two or more polymerizable compounds can be employed. Further, compounds formed by bonding a polymerizable group such as a vinyl group or a vinylidene group to a reducing agent or a color image forming substance are also employed as the polymerizable compounds. The PS plates employing these compounds which show functions as both the reducing agent and the polymerizable compound, or of the color image forming substance and the polymerizable compound are included in embodiments of the invention.

The amount of the polymerizable compound for incorporation into the light-sensitive layer preferably ranges from 5 to $1.2 \times 10^5$ times (by weight) as much as the amount of silver halide, more preferably from 10 to $1 \times 10^4$ times as much as the silver halide.

The PS plate of the invention can be prepared by arranging a light-sensitive layer containing the above-mentioned components on a support.

There is no specific limitation with respect to the support, so long as it has a stability. Examples of such support materials include paper, synthetic paper, plastic-laminated paper (e.g., polyethylene, polypropylene or polystyrene laminated paper), metallic sheets (e.g., zinc, iron or copper sheet), plastic film such as a film of cellulose acetate, cellulose propionate, cellulose butyrate, polyethylene terephthalate, polyethylene, polystyrene, polypropylene, polycarbonate or polyvinyl acetal, and the metal laminated or deposited paper or plastic film. Paper, synthetic paper, polyethylene-terephthalate film, polycarbonate film and aluminum sheet are preferred. The paper support is described in more detail in Japanese Patent Provisional Publications Nos. 61(1986)-3797 and 61(1986)-112150.

If necessary, the surface of the support may be processed. For instance, the support may be subjected to a surface-roughing treatment (graining treatment) or a treatment for making the surface hydrophilic.

The present invention will be described below by referring to the case where an aluminum sheet is used as the support.

Examples of methods for surface treatment (graining treatment) include an electrochemical graining method wherein an aluminum sheet is grained in a hydrochloric acid or nitric acid electrolytic solution by applying an electric current thereto; and mechanical graining methods such as a wire brush grain method wherein the surface of an aluminum sheet is scratched with a metal wire, a ball grain method wherein the surface of an aluminum sheet is grained with an abrasive and an abrasive ball and a brush grain method wherein the surface of an aluminum sheet is grained with a nylon brush and an abrasive. Such methods can be used singly or in combination.

The grained aluminum sheet is then etched chemically with an acid or an alkali. An industrially advantageous method is etching with an alkali.

Preferred examples of the alkaline agents include sodium carbonate, sodium aluminate, sodium metasilicate, sodium phosphate, sodium hydroxide, potassium hydroxide and lithium hydroxide. The concentration of the alkaline agent in an alkaline solution is in the range of preferably from 1 to 50 weight %. The alkaline solution is preferably used at a temperature of 20° C. to 100° C. There are preferred such conditions under which the amount of the aluminum sheet to be dissolved is 5 to 20 g/m².

Generally, after the alkali etching is complete, pickling is carried out to remove smuts which are left behind on the surface of the aluminum sheet. Preferred examples of acid used in the pickling include nitric acid, sulfuric acid, phosphoric acid, chromic acid, hydrofluoric acid, borofluoric acid, etc.

Removal of smut after the electrochemical surface-roughing treatment can be effected by a method wherein the aluminum sheet is brought into contact with a 15 to 65 weight % sulfuric acid solution at a temperature of from 50° C. to 90° C., as described in Japanese Patent Provisional Publication No. 53(1978)-12739 or a method described in Japanese Patent Publication No. 48(1973)-28123.

In the above-described way, an aluminum support whose surface has been roughened can be obtained. If desired, the aluminum support can be further subjected to an anodic oxidation treatment or a chemical treatment.

The anodic oxidation treatment may be carried out by any of conventional methods. For instance, the anodic oxidation treatment can be made by a method wherein direct current or an alternating current is applied to aluminum in sulfuric acid, phosphoric acid, chromic acid, oxalic acid, sulfamic acid or benzenesulfonic acid, a solution composed of a combination of two or more of these acids, an aqueous solution of one of said acids or an aqueous solution containing a combination of two or more of these acids to form an oxide film on anode on the surface of the aluminum support.

Process conditions for the anodic oxidation varies depending on the type of the electrolytic solution to be used, but are generally such that the concentration of the electrolytic solution is from 1 to 80 weight %, the temperature of the electrolytic solution is from 5° C. to 70° C., current density is from 0.5 to 60 A/dm², voltage is 1 to 100 V and the period of time for the electrolytic process is from 10 to 100 seconds.

As said anodic oxidation method, there are particularly preferred a method wherein anodic oxidation is carried out in sulfuric acid at a high current density, as described in British Patent No. 1,412,768 and a method wherein anodic oxidation is carried out by using an electrolytic bath as phosphoric acid, as described in U.S. Pat. No. 3,511,661.

The anodic oxidation-treated aluminum sheet may be further subjected to an alkali metal silicate treatment (for instance, a treatment wherein the sheet is immersed in an aqueous solution of sodium silicate) as described in U.S. Pat. Nos. 2,714,066 and 3,181,461. If desired, an undercoat layer composed of a hydrophilic cellulose (e.g., carboxymethylcellulose) containing a water-soluble salt (e.g., zinc acetate) may be provided on the treated aluminum sheet as described in U.S. Pat. No. 3,806,426.

Various embodiments of the PS plates, optional components which may be contained in the light-sensitive layer, and auxiliary layers which may be optionally arranged on the PS plates are described below.

The light-sensitive layer can further contain optional components such as color image forming substances, sensitizing dyes, organic silver salts, radical generators, various kinds of image formation accelerators, thermal polymerization inhibitors, thermal polymerization initiators, development stopping agents, fluorescent brightening agents, discoloration inhibitors, antihalation dyes or pigments, antiirradiation dyes or pigments, matting agents, antismudging agents, plasticizers, water releasers, binders, photo polymerization initiator, solvent of the polymerizable compound and water soluble vinyl polymers.

There is no specific limitation with respect to the color image forming substance, and various kinds of substances can be employed. Thus, examples of the color image forming substance include both colored substance (i.e., dyes and pigments) and non-colored or almost non-colored substance (i.e., color former or dye- or pigment-precursor) which develops to give a color under application of external energy (e.g., heating, pressing, light irradiation, etc.) or by contact with other components (i.e., developer). The light-sensitive material using the color image forming substance is described in Japanese Patent Provisional Publication No. 61(1986)-73145 (corresponding to U.S. Pat. No. 4,629,676 and European Patent Published Specification No. 0174634A2), and the color image forming substance can be employed for the PS plate of the invention.

There is no specific limitation with respect to the sensitizing dyes, and known sensitizing dyes used in the conventional art of photography may be employed in the PS plates. Examples of the sensitizing dyes include methine dyes, cyanine dyes, merocyanine dyes, complex cyanine dyes, complex merocyanine dyes, holopolar cyanine dyes, hemicyanine dyes, styryl dyes, and hemioxonol dyes. These sensitizing dyes can be used singly or in combination. Combinations of sensitizing dyes are often used for the purpose of supersensitization. In addition to the sensitizing dyes, a substance which does not per se exhibit spectral sensitization effect or does not substantially absorb visible light but shows supersensitizing activity can be used. The amount of the sensitizing dye to be added generally ranges from about $10^{-8}$ to about $10^{-2}$ mol. per 1 mol. of silver halide. The sensitizing dye is preferably added in the stage of the preparation of the silver halide emulsion (simultaneously with or after the grain formation).

If the heat development is to be employed in the use of the PS plate, an organic silver salt is preferably contained in the PS plate. It can be assumed that the organic silver salt takes part in a redox reaction using a silver halide latent image as a catalyst when heated to a temperature of 80° C. or higher. In such case, the silver halide and the organic silver salt preferably are located in contact with each other or close together. Examples of organic compounds employable for forming the organic silver salt include aliphatic or aromatic carboxylic acids, thiocarbonyl group-containing compounds having a mercapto group or an α-hydrogen atom, imino group-containing compounds, and the like. Benzotriazoles are most preferable. The organic silver salt is preferably used in an amount of from 0.01 to 10 mol., and more preferably from 0.01 to 1 mol., per 1 mol. of the light-sensitive silver halide. Instead of the organic silver salt, an organic compound (e.g., benzotriazole) which can form an organic silver salt in combination with an inorganic silver salt can be added to the light-sensitive layer to obtain the same effect.

Examples of the radical generators include triazenesilver, silver diazotate and an azo compound.

Various image formation accelerators are employable in the PS plates. The image formation accelerators have a function to accelerate the oxidation-reduction reaction between a silver halide (and/or an organic silver salt) and a reducing agent, a function to accelerate emigration of an image forming substance from a light-sensitive layer to an image-receiving material or an image-receiving layer, or a similar function. The image formation accelerators can be classified into inoragnic bases, organic bases, base precursors, oils, surface active agents, compounds functioning as an antifogging agent and/or a development accelerator, hot-melt solvents, antioxidants and the like. These groups, however, generally have certain combined functions, i.e., two or more of the above-mentioned effects. Thus, the above classification is for the sake of convenience, and one compound often has a plurality of functions combined.

Various examples of these image formation accelerators are shown below.

Preferred examples of the inorganic bases include hydroxides of alkali metals or alkaline earth metals; secondary or tertiary phosphates, borates, carbonates, quinolinates and metaborates of alkali metals or alkaline earth metals; a combination of zinc hydroxide or zinc oxide and a chelating agent (e.g., sodium picolinate); ammonium hydroxide; hydroxides of quaternary alkylammoniums; and hydroxides of other metals. Preferred examples of the organic bases include aliphatic amines (e.g., trialkylamines, hydroxylamines and aliphatic polyamines); aromatic amines (e.g., N-alkyl-substituted aromatic amines, N-hydroxylalkyl-substituted aromatic amines and bis[p-(dialkylamino)phenyl]-methanes), heterocyclic amines, amidines, cyclic amidines, guanidines, and cyclic guanidines. Of these bases, those having a pKa of 7 or more are preferred.

The base precursors preferably are those capable of releasing bases upon reaction by heating, such as salts between bases and organic acids capable of decarboxylation by heating, compounds capable of releasing amines through intramolecular nucleophilic substitution, Lossen rearrangement, or Beckmann rearrangement, and the like; and those capable of releasing bases by electrolysis. Preferred examples of the base precursors include guanidine trichloroacetate, piperidine trichloroacetate, morpholine trichloroacetate, p-toluidine trichloroacetate, 2-picoline trichloroacetate, guanidine phenylsulfonylacetate, guanidine 4-chlorophenylsulfonylacetate, guanidine 4-methyl-sulfonylphenylsulfonylacetate, and 4-acetylaminomethyl propionate.

These bases or base precursors are preferably used in an amount of not more than 100 weight %, and more preferably from 0.1 to 40 weight %, based on the total solid content of the light-sensitive layer. These bases or base precursors can be used singly or in combination.

In the PS plate, the silver halide, the reducing agent and the polymerizable compound are preferably contained in a microcapsule and the base or base precursor is prefarably arranged outside of the microcapsule in the light-sensitive layer. Further, the base or base precursor can be contained in a different microcapsule from that containing the polymerizable compound. The base or base precursor can be contained in the microcapsule under condition that the base or base precursor is dissolved or dispersed in an aqueous solution of a water retention agent, or under condition that the base or base precursor is adsorbed on solid particles. Furthermore, the base or base precursor can be contained in a layer different from the light-sensitive layer.

Examples of the oils employable in the invention include high-boiling organic solvents which are used as solvents in emulsifying and dispersing hydrophobic compounds.

Examples of the surface active agents employable in the invention include pyridinium salts, ammonium salts and phosphonium salts as described in Japanese Patent Provisional Publication No. 59(1984)-74547; polyalkylene oxides as described in Japanese Patent Provisional Publication No. 59(1984)-57231.

The compounds functioning as an antifogging agent and/or a development accelerator are used to give a clear image having a clear image part and a clear non-image part. Examples of the compounds include a 5- or 6-membered nitrogen containing heterocyclic compound (e.g., a cyclic amide compound), a thiourea derivative, a thioether compound, a polyethylene glycol derivative, a thiol derivative, an acetylene compound and a sulfonamide derivative.

The hot-melt solvents preferably are compounds which may be used as solvent of the reducing agent or those which have high dielectric constant and can accelerate physical development of silver salts. Examples of the hot-melt solvents include polyethylene glycols, derivatives of polyethylene oxides (e.g., oleate ester), beeswax, monostearin and high dielectric constant compounds having $-SO_2-$ and/or $-CO-$ group described in U.S. Pat. No. 3,347,675; polar compounds described in U.S. Pat. No. 3,667,959; and 1,10-decanediol, methyl anisate and biphenyl suberate described in Research Disclosure pp. 26-28 (Dec. 1976).

The antioxidants can be used to eliminate the influence of the oxygen which has an effect of inhibiting polymerization in the development process. An example of the antioxidant is a compound having two or more mercapto groups.

The thermal polymerization initiators employable in the PS plate preferably are compounds that are decomposable under heating to generate a polymerization initiating species, particularly a radical, and those commonly used as initiators of radical polymerization. The thermal polymerization initiators are described in "Addition Polymerization and Ring Opening Polymerization", pp. 6–18, edited by the Editorial Committee of High Polymer Experimental Study of the High Polymer Institute, published by Kyoritsu Shuppan (1983). Examples of the thermal polymerization initiators include azo compounds, e.g., azobisisobutyronitrile, 1,1'-azobis(1-cyclohexanecarbonitrile), dimethyl 2,2'-azobisisobutyrate, 2,2'-azobis(2-methylbutyronitrile), and azobisdimethylvaleronitrile; organic peroxides, e.g., benzoyl peroxide, di-tert-butyl peroxide, dicumyl peroxide, tert-butyl hydroperoxide, and cumene hydroperoxide; inorganic peroxides, e.g., hydrogen peroxide, potassium persulfate, and ammonium persulfate; and sodium p-toluenesulfinate. The thermal polymerization initiators are preferably used in an amount of from 0.1 to 120 weight %, and more preferably from 1 to 10 weight %, based on amount of the polymerizable compound. In a system in which the polymerizable compound within the area where the latent image has not been formed is polymerized, the thermal polymerization initiators are preferably incorporated into the light-sensitive layer. The light-sensitive material using the thermal polymerization initiators is described in Japanese Patent Provisional Publication No. 61(1986)-260241, and the thermal polymerization initiator can be employed for the PS plate of the invention.

The development stopping agents employable in the PS plate are compounds that neutralize a base or react with a base to reduce the base concentration in the layer to thereby stop development, or compounds that mutually react with silver or a silver salt to suppress development. More specifically, examples of the development stopping agents include acid precursors capable of releasing acids upon heating electrophilic compounds capable of undergoing substitution reaction with a coexisting base upon heating, nitrogen-containing heterocyclic compounds, mercapto compounds, and the like. Examples of the acid precursors include oxide esters described in Japanese Patent Provisional Publication Nos. 60(1985)-108837 and 60(1985)-192939 and compounds which release acids through Lossen rearrangement stated in Japanese Patent Provisional Publication No. 60(1985)-230133. Examples of the electrophilic compounds which induce substitution reaction with bases upon heating are described in Japanese Patent Provisional Publication No. 60(1985)-230134.

The dyes or pigments can be contained in the light-sensitive layer for the purpose of anti-halation or anti-irradiation.

The dyes having a property of being decolorized when it is heated or irradiated with light can be used in the light-sensitive material as a yellow filter layer in a conventional silver salt photographic system.

The antismudging agents employable in the PS plate preferably are particles which are solid at ambient temperatures. Examples of the antismudging agents include starch particles described in U.K. Patent No. 1,232,347; polymer particles described in U.S. Pat. No. 3,625,736; microcapsule particles containing no color former stated in U.K. Patent No. 1,235,991; and cellulose particles, and inorganic particles, such as particles of talc, kaolin, bentonite, agalmatolite, zinc oxide, titanium dioxide or aluminum oxide described in U.S. Pat. No. 2,711,375. Such particles preferably have a mean size of 3 to 50 μm, more preferably 5 to 40 μm. The size of said particle is preferably larger than that of the microcapsule.

In the case that the water soluble vinyl polymer is used, the polymers are preferably adsorbed on the silver halide grains.

Examples and usage of the other optional components which can be contained in the light-sensitive layer are also described in the above-mentioned publications and applications concerning the light-sensitive material, and in Research Disclosure Vol. 170, No. 17029, pp. 9-15 (June 1978). The light-sensitive layer preferably has a pH value of not more than 7.

Examples of auxiliary layers which are optionally arranged on the PS plate include an image-receiving layer, a heating layer, an antistatic layer, an anticurl layer, a release layer, a cover sheet or a protective layer, a layer containing a base or base precursor, and a base barrier layer.

Examples and usage of the other auxiliary layers are also described in the above-mentioned publications and applications concerning the light-sensitive material.

The PS plate can be prepared, for instance, by the following process.

The PS plate is usually prepared by dissolving, emulsifying or dispersing each of the components of the light-sensitive layer in an adequate medium to obtain coating solution, and then coating the obtained coating solution on a support.

The coating solution can be prepared by mixing liquid compositions each containing a component of the light-sensitive layer. A liquid composition containing two or more components can be used in the preparation of the coating solution. Some components of the light-sensitive layer can be directly added to the coating solution or the liquid composition. Further, a secondary composition can be prepared by emulsifying an oily (or an aqueous) composition in an aqueous (or an oily) medium to obtain the coating solution.

Preparations of liquid compositions and coating solutions of the components contained in the light-sensitive layer are described hereinbelow.

The silver halide is preferably prepared in the form of a silver halide emulsion. Various processes for the preparation of the silver halide emulsion are known in the conventional technology for the preparation of photographic materials.

The silver halide emulsion can be prepared by the acid process, neutral process or ammonia process. In the stage for the preparation, a soluble silver salt and a halogen salt can be reacted in accordance with the single jet process, double jet process or a combination thereof. A reverse mixing method, in which grains are formed in the presence of excess silver ions, or a controlled double jet process, in which a pAg value is maintained constant, can be also employed. In order to accelerate grain growth, the concentrations or amounts or the silver salt and halogen salt to be added or the rate of their addition can be increased as described in Japanese Patent Provisional Publication Nos. 55(1980)-142329 and 55(1980)-158124, and U.S. Pat. No. 3,650,757, etc.

The silver halide emulsion may be of a surface latent image type that forms a latent image predominantly on the surface of silver halide grains, or of an inner latent image type that forms a latent image predominantly in the interior of the grains. A direct reversal emulsion comprising an inner latent image type emulsion and a nucleating agent may be employed. The inner latent image type emulsion suitable for this purpose is described in U.S. Pat. Nos. 2,592,250 and 3,761,276, Japanese Patent Publication No. 58(1983)-3534 and Japanese Patent Provisional Publication No. 57(1982)-136641, etc. The nucleating agent that is preferably used in combination with the inner latent image type emulsion is described in U.S. Pat. Nos. 3,227,552, 4,245,037, 4,255,511, 4,266,013 and 4,276,364, and West German Patent Provisional Publication (OLS) No. 2,635,316.

In the preparation of the silver halide emulsions, hydrophilic colloids are advantageously used as protective colloids. Examples of the hydrophilic colloids include proteins, e.g., gelatin, gelatin derivatives, gelatin grafted with other polymers, albumin, and casein; cellulose derivatives, e.g., hydroxyethyl cellulose, carboxymethyl cellulose, cellulose sulfate, etc.; saccharide derivatives, e.g., sodium alginate and starch derivative; and a wide variety of synthetic hydrophilic polymers, such as polyvinyl alcohol, polyvinyl alcohol partial acetal, poly-N-vinylpyrrolidone, polyacrylic acid, polymethacrylic acid, polyacrylamide, polyvinylimidazole, and polyvinylpyrazole, and copolymers comprising monomers constituting these homopolymers. Among them, gelatin is most preferred. Examples of employable gelatins include not only lime-processed gelatin, but also acid-processed gelatin and enzyme-processed gelatin. Hydrolysis products or enzymatic decomposition products of gelatin can also be used.

In the formation of silver halide grains in the silver halide emulsion, ammonia, an organic thioether derivative as described in Japanese Patent Publication No. 47(1972)-11386 or sulfur-containing compound as described in Japanese Patent Provisional Publication No. 53(1978)-144319 can be used as a silver halide solvent. Further, in the grain formation or physical ripening, a cadmium salt, a zinc salt, a lead salt, a thallium salt, or the like can be introduced into the reaction system. Furthermore, for the purpose of improving high or low intensity reciprocity law failure, a water-soluble iridium salt, e.g., iridium (III) or (IV) chloride, or ammonium hexachloroiridate, or a water-soluble rhodium salt, e.g., rhodium chloride can be used.

After the grain formation or physical ripening, soluble salts may be removed from the resulting emulsion by a known noodle washing method or a sedimentation method. The silver halide emulsion may be used in the primitive condition, but is usually subjected to chemical sensitization. Chemical sensitization can be carried out by the sulfur sensitization, reduction sensitization or noble metal sensitization, or a combination thereof that are known for emulsions for the preparation of the conventional light-sensitive materials, and these methods can be employed for the PS plate of the invention.

When the sensitizing dyes are added to the silver halide emulsion, the sensitizing dye is preferably added in the course of the preparation of the emulsion. When the organic silver salts are introduced into the light-sensitive microcapsule, the emulsion of the organic silver salts can be prepared in the same manner as in the preparation of the silver halide emulsion.

The polymerizable compounds are used as the medium for preparation of the liquid composition containing another component of the light-sensitive layer. For example, the silver halide (including the silver halide emulsion), the polymer binder having a cross-linkable double bonding group at side chain and the reducing agent can be dissolved, emulsified or dispersed in the polymerizable compound to prepare the PS plate. Especially, the color image forming substance is preferably incorporated into the polymerizable compound.

When a light-sensitive layer containing lipophilic continuous phase (which is the preferred embodiment of the present invention) is prepared, the polymer binder is preferably added to the polymerizable compound together with an organic solvent.

The organic solvent having a low solubility of water is preferred in order to form a lipophilic continuous phase containing silver halide emulsion. Examples of the solvents include esters such as ethyl acetate, n-propyl acetate, butyl acetate and ethyl propionate; ketones such as methylisobutyl ketone, diethyl ketone and diisobutyl ketone; ethers such as dichloroethyl ether, isopropyl ether and anisole; hydrocarbon halides such as methylene chloride, ethylene chloride and trichloro ethane.

As described above, the polymer binder of the present invention may be added to a solution containing the polymerizable compound before emulsifying and dispersing the silver halide, or added to a coating solution for preparation of the light-sensitive layer after emulsifying or dispersing the silver halide emulsion in consideration of the suitability such as the emulsifying condition depending on the kinds of binders.

Further, in the case that the oil droplets of the polymerizable compound is encapsulated, the necessary components for preparation of a microcapsule, such as shell material can be incorporated into the polymerizable compound.

The silver halide is contained in the oil droplets of the polymerizable compound which are dispersed in the light-sensitive layer. The reducing agent, the color image forming substance and other optional components can be contained in the oil droplets or arranged outside of the oil droplets in the light-sensitive layer. Generally, the reducing agent is preferably contained in the oil droplets, because the reaction can progress smoothly in such case. In the case that the silver halide is contained in the oil droplets, five or more silver halide grains are preferably contained in the oil droplets.

The oil droplets of the polymerizable compound are preferably in the form of microcapsules, and various known manners can be employed.

Examples of the process for the preparation of the microcapsules include a process utilizing coacervation of hydrophilic wall-forming materials as described in U.S. Pat. Nos. 2,800,457 and 2,800,458; an interfacial polymerization process as described in U.S. Pat. No. 3,287,154, U.K. Patent No. 990,443 and Japanese Patent Publication Nos. 38(1963)-19574, 42(1967)-446 and 42(1967)-771; a process utilizing precipitation of polymers as described in U.S. Pat. Nos. 3,418,250 and 3,660,304; a process of using isocyanate-polyol wall materials as described in U.S. Pat. No. 3,796,669; a process of using isocyanate wall materials as described in U.S. Pat. No. 3,914,511; a process of using urea-formaldehyde or urea-formaldehyde-resorcinol wall-forming materials as described in U.S. Pat. Nos. 4,001,140, 4,087,376 and 4,089,802; a process of using melamine-formaldehyde resins, hydroxypropyl cellulose or like as a wall-forming material as described in U.S. Pat. No. 4,025,455; an in situ process utilizing polymerization of monomers as described in U.K. Patent No. 867,797 and U.S. Pat. No. 4,001,140; an electrolytic dispersion and cooling process as described in U.K. Patent Nos. 952,807 and 965,074; and a spray-drying process as described in U.S. Pat. No. 3,111,407 and U.K. Patent No. 930,422. It is preferable, though not limitative, that the microcapsule is prepared by emulsifying core materials containing the polymerizable compound and forming a polymeric membrane (i.e., shell or wall) over the core materials.

There is no specific limitation on the shell material of the microcapsule, and various known materials can be used. However, it is preferred that the shell material which is used in the invention is lipophilic and has a contact angle of not less than 40°. Examples of the shell material include polyurea, polyurethane, polyethylene, polyamide, polyester, polycarbonate, polyethyleneamine, phenol-formalin resin, melamine resin, vinyl polymer and vinyl copolymer, polyacrylonitrile, polyvinyl acetal resin, cellulose acetate, polypropylene, polybutadiene and their mixtures.

The light-sensitive composition which is the polymerizable compound containing the silver halide can be prepared using the silver halide emulsion.

The silver halide emulsion is dispersed in the lipophilic continuous phase in the same manner as the process for incorporating the silver halide emulsion into the polymerizable compound.

The light-sensitive composition can be also prepared using silver halide powders which can be prepared by lyophilization. These light-sensitive composition can be obtained by stirring the polymerizable compound and the silver halide using a homogenizer, a blender, a mixer or other conventional stirring device.

Polymers having a principal chain consisting essentially of a hydrocarbon chain substituted in part with hydrophilic groups which contain, in their terminal groups, —OH or nitrogen having a lone electron-pair are preferably introduced into the polymerizable compound prior to the preparation of the light-sensitive composition. The polymer has a function of dispersing silver halide or other component in the polymerizable compound very uniformly as well as a function of keeping thus dispered state. Further, the polymer has another function of gathering silver halide along the interface between the polymerizable compound (i.e., light-sensitive composition) and the aqueous medium in preparation of the microcapsule. Therefore, using this polymer, silver halide can be easily introduced into the shell material of the microcapsule.

The light-sensitive composition can be also prepared by dispersing microcapsule containing silver halide emulsion as a core structure in the polymerizable compound instead of employing the above polymer.

Further, optional components, such as the reducing agents, the color image forming substances may dissolved, emulsified or dispersed in the light-sensitive composition. Furthermore, the necessary components for preparation of the microcapsule, such as shell wall-forming materials can be incorporated into in the light-sensitive composition.

When the polymerizable compound is the light-sensitive composition containing silver halide and the binder of the invention, the emulsion itself can be used as a coating solution for preparation of the light-sensitive layer. Other emulsions may be mixed with the silver halide emulsion, binder and optionally organic silver salt emulsion to prepare a coating solution.

The PS plate of the invention can be prepared by coating and drying the above-prepared coating solution on a support. The coating solution is coated on the support in a conventional manner.

A protective layer is preferably provided on the light-sensitive layer to prevent a polymerization inhibition by oxygen when the polymerizable compound is polymerized. The protective layer preferably has a non-permeability to oxygen, no tackiness under high temperature and high moisture, improved in adhesive property to the light-sensitive layer and improved in ink adhesion when printing. The protective layer consisting of polyvinyl pyrrolidone, polyvinyl alcohol, gelatin and gum arabic described in Japanese Patent Publication No. 46(1971)-32714, or copolymers of carboxylic acid unsaturated and ethylenic unsaturated compound are preferred. Solid particles of polyfluoroethylene addition polymer described in Japanese Patent Publication No. 47(1972)-469, or betain type surface active agent may be contained in the protective layer.

Use of the PS plate is described below.

In the use of the PS plate of the invention, simultaneously with or after imagewise exposure, a treatment carried out to form a lipophilic film within the area where the polymerizable compound is not polymerized.

Various exposure means can be employed in the imagewise exposure, and in general, the latent image of the silver halide is obtained by imagewise exposure to radiation including visible light. The type of light source and exposure can be selected depending upon the light-sensitive wavelengths determined by spectral sensitization or sensitivity of silver halide. Examples of the light sources include mercury vapor lamp, metal halide lamp, xenon lamp, chemical lamp, carbon arc lamp, tungsten lamp and infrared lamp. Scanning exposure with laser beams can be used in the invention. Examples of the laser beams include semiconductor laser, helium-neon laser, argon laser, krypton laser and helium-cadmium laser beams.

As the development process of the PS plate of the invention, a heat (thermal) development process is preferred, because the process can be simply operated and the development can be conducted within a short time. Such a heat development process is described in more detail in Japanese Patent Provisional Publication No. 61(1986)-69062.

Heating in the heat development process can be conducted in various known manners. The heating layer which is arranged on the PS plate can be used as the heating means in the same manner as the light-sensitive material described in Japanese Patent Provisional Publication No. 61(1986)-294434, or a process wherein the heat development is carried out while controlling the amount of oxygen present in the light-sensitive material as in the image forming method disclosed in Japanese Patent Provisional Publication No. 62(1987)-210461. Heating temperatures for the development process generally ranges from 80° C. to 200° C., and preferably from 100° C. to 160° C. The heating time is generally from 1 second to 5 minutes, and preferably from 5 seconds to 1 minute.

Instead of bases or base precursors contained in the light-sensitive material, the development can be proceeds simultaneously or thereafter the bases or base precursors added to the light-sensitive layer. A base sheet (i.e., a sheet in which a base is contained) is preferably employed.

During the above development process, a polymerizable compound within the area where a latent image of the silver halide has been formed or within the area where a latent image of the silver halide has not been formed is polymerized. In a general system, the polymerizable compound within the area where the latent image has been formed is polymerized. If the nature or amount of the reducing agent is controlled, the polymerizable compound within the area where the latent image has not been formed can be polymerized in the same manner as in the light-sensitive material described in Japanese Patent Provisional Publication No. 61(1986)-260241.

When the PS plate of the present invention is developed by heating after pattern exposure, a polymerization reaction (crosslinking reaction between the polymerizable compound and the binder polymer, and/or among molecules of the binder polymers) in a part where the polymerizable compound and the binder polymer of the invention are present in the exposed part proceeds to form an image area (ink-receptive part). On the other hand, a part where the polymerizable compound and the binder of the invention are present in a unexposed part remain still uncured to form a non-image area (hydrophilic part) by developing to remove using ethanol. When the protective layer is provided, the unexposed area is removed by wash-off after exposure and development.

In the above process, the PS plate having the image area (i.e., lipophilic part) and the non-image area (i.e., hydrophilic part) can be prepared.

In the above embodiment, there has been described a method for preparing a lithographic plate wherein the polymerizable compound within the area where a latent image of silver halide has been formed is polymerized. However, a lithographic plate can also be prepared by a method wherein the polymerizable compound within the area where a latent image of silver halide has not been formed is polymerized as described above.

The light-sensitive material of the present invention has been described by referring to the case of using for the PS plate. The light-sensitive material of the invention can further be used for monochromatic or color photography, printing, radiography, diagnosis (e.g., CRT photography of diagnostic device using supersonic wave), copy (e.g., computer-graphic hard copy), etc.

The present invention is further described by the following examples without limiting the invention.

EXAMPLE 1

Preparation of silver halide emulsion

In 3,000 ml of water were dissolved 40 g of gelatin and 23.8 g of pottasium bromide, and the resulting gelatin solution was kept at 50° C. To the gelatin solution, 200 ml of an aqueous solution containing 34 g of silver nitrate was added over a period of 10 minutes while stirring. To the solution, 100 ml of an aqueous solution containing 3.3 g of potassium iodide was added over a period of 2 minutes to obtain a silver bromoiodide emulsion. After the emulsion was adjusted to a pH for sedimentation, excess salts were removed, and the emulsion was adjusted to a pH of 6.0 to obtain a silver iodobromide emulsion. The yield of the emulsion was 400 g.

Preparation of light-sensitive composition

The following components were stirred at 15,000 r.p.m. for 10 minutes to obtain a dispersion containing light-sensitive composition.

| | |
|---|---|
| Trimethylolpropane triacrylate | 2.68 g |
| Copolymer (I) | 0.16 g |
| Copolymer (II) | 5.36 g |
| (molecular weight: approx 20,000) | |
| Ethyl acetate | 41.00 g |
| Emulex NP-8 | 0.72 g |
| (tradename of Nippon Emulsion Co., Ltd.) | |
| Silver halide emulsion | 8.0 g |
| 10% Aqueous solution of potassium bromide | 0.68 g |
| 10% Methanol solution of 1-phenyl-5-mercapto tetrazole | 0.68 g |
| 0.1% Methanol solution of Sensitizing dye (a) | 0.50 g |

(Copolymer (I))

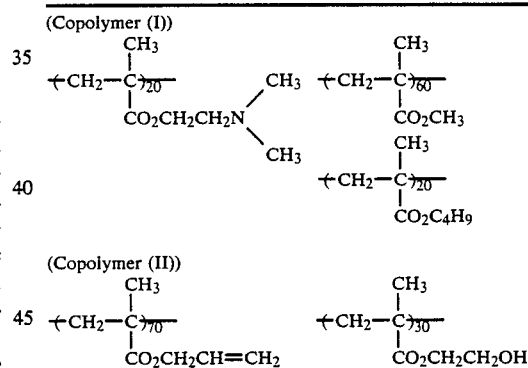

(Copolymer (II))

Remark: numbers attached to brackets mean mole % in each repeating units, similar to hereinafter.

(Sensitizing dye (a))

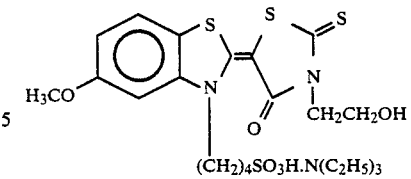

Preparation of support

A surface of an aluminum sheet having a thickness of 0.30 mm was grained using a nylon brush and an aqueous suspension containing a pumice powder on 400 mesh, and then the sheet was washed with water. The aluminum sheet was immersed in 10% aqueous sodium hydroxide solution at 70° C. for 60 seconds for etching. Thereafter, the sheet was washed with running water, neutralized, and then washed using 20% aqueous solution of nitric acid. Subsequently, in 1% aqueous solution of nitric acid, the electrochemical surface-roughing treatment was effected in the anoidically electric amount of 160 coulomb/dm² under such conditions as anoidically voltage of 12.7 V and the cathode electric amount ratio to the anoidically electric amount of 0.8 using sine wave alternating-corrugated current. The center line average height (Ra) was 0.6 μm. Then, the sheet was immersed in 30% aqueous sulfuric acid and desmutted at 55° C. for 2 minutes. The sheet was subjected to anoidic electric treatment to give an anoidized layer of a thickness of 2.7 g/dm² at current density of 2 A/dm².

Preparation of PS plate

To the above obtained dispersion were added a solution in which 1.68 g of the following reducing agent (I) and 1.68 g of the following reducing agent (II) was dissolved in 6.4 g of methylene chloride and a solution in which 0.35 g of guanidine trichloroacetate was dissolved in a mixture of 2.1 g of ethyl acetate and 1.05 g of methanol to prepare a coating solution for the light-sensitive layer. On the aluminum support was coated the coating solution and dried to give a light-sensitive layer of 4.0 g/m².

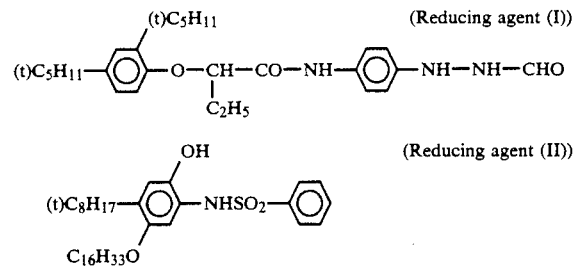

On a surface of the light-sensitive layer was coated 3% aqueous solution of polyvinyl alcohol (viscosity: 5.3±0.5 cP (measured using Hoppler viscometer in 4% aqueous solution at the temperature of 20° C.), saponification degree: 86.5 to 89.0 mole %, polymerization degree: more than 1,000) and dried to give an over coat layer of 1.5 g/m². Thus, a PS plate (A) having an aluminum support, a light-sensitive layer and an overcoat layer was obtained.

Evaluation of PS plate

On the PS plate (A) was placed a negative film and exposed to light of a tungsten lamp of 500 W at 500 lux for 2 seconds and then heated to develop at 140° C. for 20 seconds to obtain a latent image. The PS plate was then washed in a hot water at 40° C. for 30 seconds to dissolve out the overcoat layer consisting of polyvinyl alcohol, and then was developed in methanol to obtain an image relief by removing the material of the area where the latent image was not formed (uncured area). Thus, a lithographic plate was obtained.

The lithographic plate was mounted on a Heidelberg KOR-D type printing machine, and a printing operation was performed. As a result, a print having a clear image was obtained.

EXAMPLES 2 AND 3

Each of PS plates (B) and (C) was prepared in the same manner as in Example 1, except that each of the following copolymer (III) (molecular weight: approx. 20,000) and the following copolymer (IV) (molecular weight: approx. 60,000) was respectively used instead of the copolymer (II).

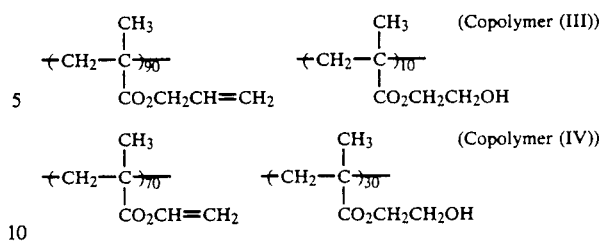

Each of the PS plates (B) and (C) was developed after exposure in the same manner as in Example 1, lithographic plates (B) and (C) were prepared. Each of the lithographic plates (B) and (C) was mounted on the Heidelberg KOR-D type printing machine, and a printing operation was performed. As a result, a print having a clear image was obtained.

EXAMPLE 4

A light-sensitive composition was prepared in the same manner as in Example 1, except that the copolymer (II) was not used, and then to the light-sensitive composition was added 24.6 g of 20% methanol solution of the following copolymer (V) (molecular weight: 100,000) to obtain a coating solution for the preparation of the light-sensitive layer. Thus, a PS plate (D) was prepared.

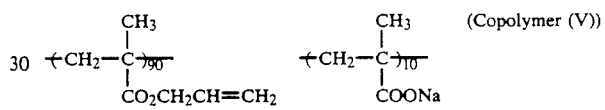

The PS plate (D) was developed after exposure in the same manner as in Example 1, and was further developed in water at temperature of 30° C. for 2 minutes to obtain a lithographic plate (D).

The lithographic plate (D) was mounted in the Heidelberg KOR-D type printing machine, and a printing operation was performed. As a result, a print having a clear image was obtained.

We claim:

1. A light-sensitive material comprising a light-sensitive layer containing a light-sensitive silver halide, a reducing agent and a polymerizable compound having an ethylenic unsaturated group provided on a support, wherein the light-sensitive layer contains a polymer binder having an ethylenic unsaturated double bonding group in its side chain, wherein said polymer binder comprises at least one copolymer derived from a first monomer selected from the group consisting of allyl acrylate, allyl methacrylate, vinyl acrylate and vinyl methacrylate and a second monomer copolymerizable with the first monomer.

2. The light-sensitive material as claimed in claim 1, wherein the light-sensitive layer contains the polymer binder in an amount of 5 to 70 weight % based on the total amount of materials constituting in the light-sensitive layer.

3. The light-sensitive material as claimed in claim 1, wherein the polymer binder has a molecular weight in the range of from 10,000 to 500,000.

4. The light-sensitive material as claimed in claim 1, wherein the light-sensitive layer consists of a lipophilic continuous phase.

5. The light-sensitive material as claimed in claim 1, wherein the support is a hydrophilic support.

6. The light-sensitive material as claimed in claim 1, wherein an overcoat layer is provided on the light-sensitive layer.

* * * * *